United States Patent [19]

Hemminger et al.

[11] Patent Number: 5,621,629

[45] Date of Patent: *Apr. 15, 1997

[54] SWITCHING POWER SUPPLY FOR USE IN AN ELECTRONIC ENERGY METER HAVING A WIDE RANGE OF INPUT VOLTAGES

[75] Inventors: Rodney C. Hemminger; Mark L. Munday, both of Raleigh, N.C.; Fred F. Schleifer, Grand Chute, Wis.

[73] Assignee: ABB Power T&D Company Inc., Raleigh, N.C.

[*] Notice: The term of this patent shall not extend beyond the expiration date of Pat. No. 5,457,621.

[21] Appl. No.: 479,137

[22] Filed: Jun. 7, 1995

Related U.S. Application Data

[63] Continuation of Ser. No. 384,398, Feb. 3, 1995, Pat. No. 5,457,621, which is a continuation of Ser. No. 259,116, Jun. 10, 1994, abandoned, which is a continuation of Ser. No. 839,967, Feb. 21, 1992, abandoned.

[51] Int. Cl.$^6$ ................................................. H02H 7/122
[52] U.S. Cl. .................. 363/56; 363/21; 363/97; 363/131
[58] Field of Search .................. 363/20, 21, 50, 363/53, 56, 97, 131

[56] References Cited

U.S. PATENT DOCUMENTS

| | | | |
|---|---|---|---|
| 3,976,941 | 8/1976 | Milkovic | 324/142 |
| 4,156,273 | 5/1979 | Sato | 363/56 |
| 4,209,826 | 6/1980 | Priegnitz | 363/21 |
| 4,389,702 | 6/1983 | Clemente et al. | 363/56 |
| 4,438,485 | 3/1984 | Voigt | 363/21 |
| 4,497,017 | 1/1985 | Davis | 363/21 |
| 4,509,128 | 4/1985 | Coppola et al. | 364/483 |
| 4,566,060 | 1/1986 | Hoeksma | 363/97 |
| 4,607,320 | 8/1986 | Matui et al. | 363/97 |
| 4,622,627 | 11/1986 | Rodriguez et al. | 363/21 |
| 4,623,960 | 11/1986 | Eng | 363/56 |
| 4,700,280 | 10/1987 | Onda et al. | 363/131 |
| 4,761,725 | 8/1988 | Henze | 363/46 |
| 4,866,587 | 9/1989 | Wadlington | 363/97 |
| 4,922,399 | 5/1990 | Tsuzuki | 363/56 |
| 4,956,761 | 9/1990 | Higashi | 363/97 |
| 4,975,592 | 12/1990 | Hahn et al. | 363/21 |
| 5,019,955 | 5/1991 | Hoeksma | 363/97 |
| 5,140,511 | 8/1992 | Lee et al. | 363/21 |
| 5,175,675 | 12/1992 | Uramoto | 363/131 |
| 5,457,621 | 10/1995 | Munday et al. | 363/56 |

Primary Examiner—Jeffrey L. Sterrett
Attorney, Agent, or Firm—Woodcock Washburn Kurtz Mackiewicz & Norris

[57] ABSTRACT

Methods and apparatus for supplying power for use in metering electrical energy over a wide range of voltages with a single meter are disclosed. The wide ranging meter includes a processing unit for processing divided input voltage and a current component in order to determine electrical energy metering values. The processing unit is operable in response to supply voltages. A power supply, receives an undivided voltage component and generates supply voltages over the wide dynamic range. It is especially preferred for the power supply to include a transformer having first, second and third windings, wherein the undivided voltage component is provided to the first winding and wherein the second winding defines the output of the power supply. A switching member is connected to the first winding for permitting and preventing the flow of current in response to a control signal. A control member generates the control signal in response to the output of the power supply. It is also preferred for the control signal to disable the switch member. It is further preferred for the power supply to include a voltage blocking clamp, connected to the transformer for blocking the voltage applied to the transformer. It is still further preferred for an oscillator to be used to generate an oscillating signal for switching the switching member ON and OFF so that the switching member is provided a substantially constant OFF time.

68 Claims, 6 Drawing Sheets

SWITCHING POWER SUPPLY FOR USE IN AN ELECTRONIC ENERGY METER HAVING A WIDE RANGE OF INPUT VOLTAGES

RELATED APPLICATION DATA

This application is a continuation of U.S. patent application Ser. No. 08/384,398, filed Feb. 3, 1995 now U.S Pat. No. 5,457,621, which is a continuation of U.S. patent application Ser. No. 08/259,116, filed Jun. 10, 1994, abandoned, which is a continuation of U.S. patent application Ser. No. 07/839,967, filed Feb. 21, 1992, abandoned.

FIELD OF INVENTION

The present invention relates generally to the field of electric utility meters. More particularly, the present invention relates to electronic utility watthour meters or meters utilized to meter real and reactive energy in both the forward and reverse directions.

BACKGROUND OF THE INVENTION

Electric utility companies and power consuming industries have in the past employed a variety of approaches to metering electrical energy. Typically, a metering system monitors power lines through isolation and scaling components to derive polyphase input representations of voltage and current. These basic inputs are then selectively treated to determine the particular type of electrical energy being metered. Because electrical uses can vary significantly, electric utility companies have requirements for meters configured to analyze several different nominal primary voltages. The most common of these voltages are 120, 208, 240, 277 and 480 volts RMS. Presently, available meters have a different style for each of these applications, both electro-mechanical and electronic. This forces the electric utility companies to inventory, test and maintain many different styles of meters. Consequently, a need exists for reducing the number of meter types a utility need inventory by providing a meter capable of operation over a wide dynamic range.

The problem of wide amperage dynamic range was addressed in U.S. Pat. No. 3,976,941—Milkovic. It was there recognized that solid state electronic meters were becoming more desirable in metering applications, however, such solid state meters had a critical drawback in their amperage dynamic range. An effort was described to improve the amperage dynamic range of solid state meters so that such meters would be operationally equivalent to prior electro-mechanical meters. The problem with such meters, however, was their failure to address the multiple voltage situation. Utility companies utilizing such meters would still be forced to inventory, test and maintain many different styles of meters in order to service the various voltages provided to customers.

It has been recognized in various meter proposals that the use of a microprocessor would make metering operations more accurate. It will be understood, however, that the use of a microprocessor requires the provision of one or more supply voltages. Power supplies capable of generating a direct current voltage from the line voltage have been used for this purpose. Since electric utility companies have requirements for various nominal primary voltages, it has been necessary to provide power supplies having individualized components in order to generate the microprocessor supply voltages from the nominal primary voltage.

Consequently, a need exists for a single meter which is capable of metering electrical energy associated with nominal primary voltages in the range from 96 to 528 volts RMS. Applicants resolve the above problems through the use of a switching power supply and voltage dividers. It will be recognized that switching power supplies are known. However, the use of such a power supply in an electrical energy meter is new. Moreover, the manner of the present invention, the particular power supply construction and its use in an electrical energy meter is novel.

It will also be noted, in order to solve the inventory problem, designing a wide voltage range meter in the past involved the use of voltage transformers to sense line voltage. A significant problem associated with the use of such transformers was the change in phase shift and the introduction of non-linearities that would occur over a wide voltage range. It was not easy to remove such a widely changing phase shift or to compensate for the non-linearities.

Consequently, a need still exists for a single meter which is capable of metering electrical energy associated with nominal primary voltages that also minimizes phase shift in the voltage sensors over a wide voltage range.

SUMMARY OF THE INVENTION

The previously described problem is resolved and other advantages are achieved in a method and apparatus for metering electrical energy over a wide range of voltages with a single meter. The wide ranging meter includes a divider network for dividing the voltage thereby generating a divided voltage. It is preferred to generate a divided voltage that is substantially linear with minimal phase shift over the wide dynamic range. A processing unit processes the divided voltage and a current component to determine electrical energy metering values. The processing unit requires stable supply voltages for operation. A power supply, connected to receive the voltage component and connected to the processing unit, generates the supply voltages from the voltage component over the wide dynamic range.

It is especially preferred for the power supply to include a transformer having first, second and third windings, wherein the voltage component is provided to the first winding and wherein the second winding defines the output of the power supply. A switching member is connected to the first winding for permitting and preventing the flow of current through the first winding. The switch member is operable in response to a control signal. A control member generates the control signal in response to the output of the power supply and is connected to the third winding.

In the preferred embodiment, the control member consists of an oscillator, a current sensor for sensing the flow of the current through the transformer primary, comparators, and various other components. In response to the sensed current, the output voltage, and an inhibit signal from a voltage clamping circuit, the control member either completely disables the switching member or supplies the switching member with a control signal representing the ON and OFF times that the switching member must provide in order to maintain the proper output voltage of the supply.

It is also preferred for the control signal to disable the switch member. Such an embodiment is achieved by the switching member including a first transistor, connected between the primary winding and ground, and an oscillator, connected to the base of the first transistor, for generating an oscillating signal for switching the transistor on and off. In such a device the control signal causes the output of the oscillator to disable the first transistor. It is also preferred for the control member to include a current sensor for sensing the current flowing through the primary winding and for generating a sensed current signal. A reference current generator generates a reference current signal in response to the output of the power supply. A comparator compares the sensed current and the reference current. In such an embodiment, it is preferred for the control signal to be generated in response to the comparator determining that the sensed currrent signal exceeds the reference current signal.

BRIEF DESCRIPTION OF THE DRAWINGS

The present invention will be better understood, and its numerous objects and advantages will become apparent to those skilled in the art by reference to the following detailed description of the invention when taken in conjunction with the following drawings, in which.

DETAILED DESCRIPTION

Figure 1:
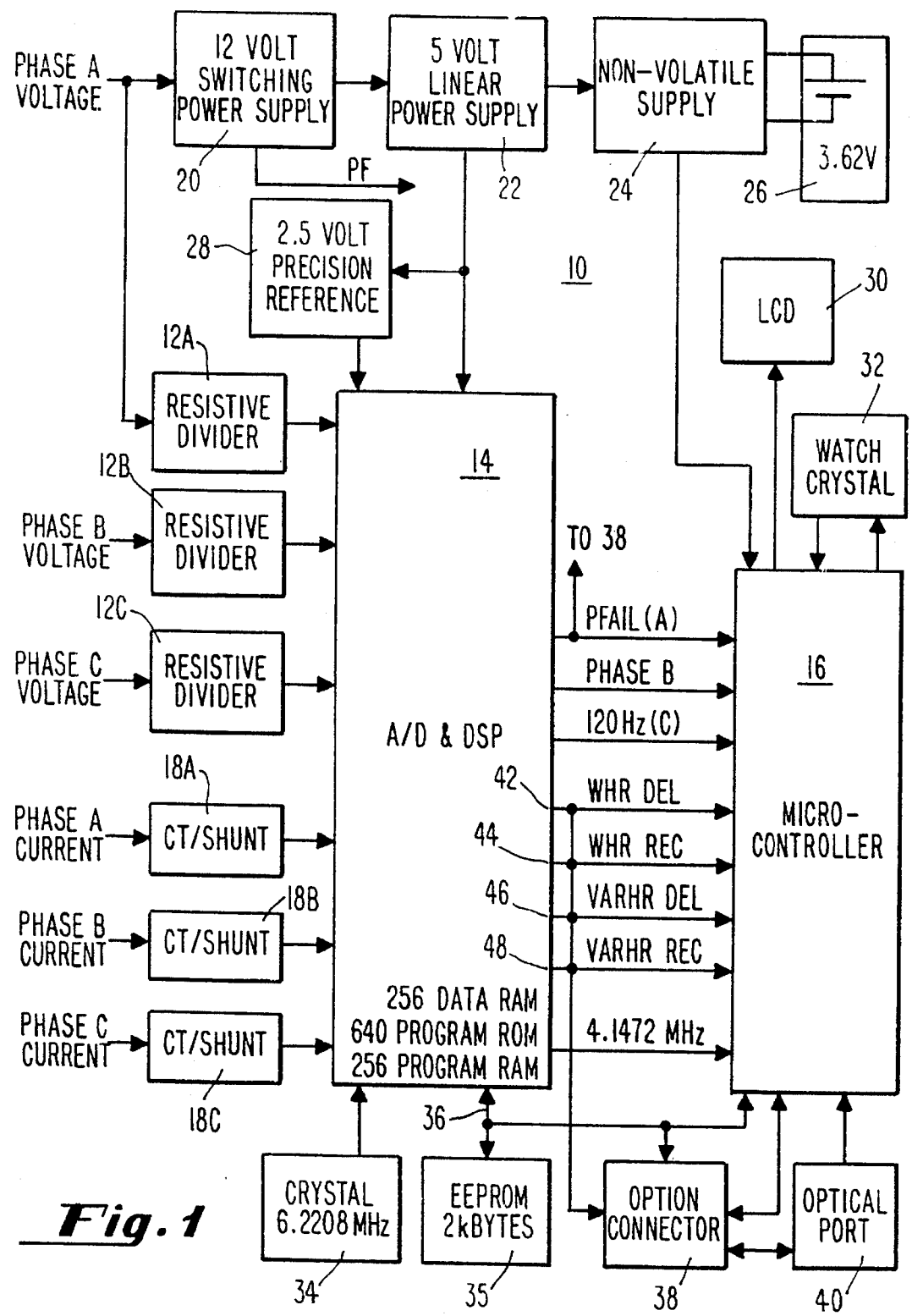
FIG. 1 is a block diagram of an electronic meter constructed in accordance with the present invention.

A new and novel meter for metering electrical energy is shown in FIG. 1 and generally designated 10. It is noted at the outset that this meter is constructed so that the future implementation of higher level metering functions can be supported.

Meter 10 is shown to include three resistive voltage divider networks 12A, 12B, 12C; a first processor—an ADC/DSP (analog-to-digital converter/digital signal processor) chip 14; a second processor—a microcontroller 16 which in the preferred embodiment is a Mitsubishi Model 50428 microcontroller; three current sensors 18A, 18B, 18C; a 12 V switching power supply 20 that is capable of receiving inputs in the range of 96–528 V; a 5 V linear power supply 22; a non-volatile power supply 24 that switches to a battery 26 when 5 V supply 22 is inoperative; a 2.5 V precision voltage reference 28; a liquid crystal display (LCD) 30; a 32.768 kHz oscillator 32; a 6.2208 MHz oscillator 34 that provides timing signals to chip 14 and whose signal is divided by 1.5 to provide a 4.1472 MHz clock signal to microcontroller 16; a 2 kByte EEPROM 35; a serial communications line 36; an option connector 38; and an optical communications port 40 that may be used to read the meter. The inter-relationship and specific details of each of these components is set out more fully below.

It will be appreciated that electrical energy has both voltage and current characteristics. In relation to meter 10 voltage signals are provided to resistive dividers 12A–12C and current signals are induced in a current transformer (CT) and shunted. The output of CT/shunt combinations 18A–18C is used to determine electrical energy.

First processor 14 is connected to receive the voltage and current signals provided by dividers 12A–12C and shunts 18A–18C. As will be explained in greater detail below, processor 14 converts the voltage and current signals to voltage and current digital signals, determines electrical energy from the voltage and current digital signals and generates an energy signal representative of the electrical energy determination. Processor 14 will always generate a watthour delivered (Whr Del) and, watthour received (Whr Rec), depending on the type of energy being metered, will generate either a volt amp reactive hour delivered (Varhr Del)/a volt amp reactive hour received (Varhr Rec) signal or volt amp hour delivered (Vahr Del)/volt amp hour received (Vahr Rec) signal. In the preferred embodiment, each transition on conductors 42–48 (each logic transition) is representative of the measurement of a unit of energy. Second processor 16 is connected to first processor 14. As will be explained in greater detail below, processor 16 receives the energy signal(s) and generates an indication signal representative of said energy signal.

It will be noted again that meter 10 is a wide range meter capable of metering over a voltage range from 96–528 V. The components which enhance such a wide range meter include the divider network 12A–12C, which as previously noted are connected to receive the voltage component. The dividers generate a divided voltage, wherein the divided voltage is substantially linear voltage with minimal phase shift over the wide dynamic range, i.e. 96–528 Volts. A processing unit (processors 14 and 16) are connected to receive the divided voltage and the current component. The processing unit processes the divided voltages and the current components to determine electrical energy metering values. It will be appreciated from the following description that processors 14 and 16 require stable supply voltages to be operable. A power supply, connected to receive the voltage component and connected to processors 14 and 16, generate the necessary supply voltages from the Phase A voltage component over the wide dynamic range. Power supply 20 could also run off of phase B and phase C voltages or a combination of the above. However, a combination embodiment would require additional protection and rectifying components.

In relation to the preferred embodiment of meter 10, currents and voltages are sensed using conventional current transformers (CT's) and resistive voltage dividers, respectively. The appropriate multiplication is accomplished in a new integrated circuit, i.e. processor 14. Processor 14 is essentially a programmable digital signal processor (DSP) with built in multiple analog to digital (A/D) converters. The converters are capable of sampling multiple input channels simultaneously at 2400 Hz each with a resolution of 21 bits and then the integral DSP performs various calculations on the results. For a more detailed description of Processor 14, reference is made to a copending application Ser. No. 07/839,182 filed on Feb. 21, 1991 and abandoned in favor of application Ser. No. 08/259,578, which is incorporated herein by reference and which is owned by the same assignee as the present application.

Meter 10 can be operated as either a demand meter or as a time-of-use (TOU) meter. It will be recognized that TOU meters are becoming increasingly popular due to the greater differentiation by which electrical energy is billed. For example, electrical energy metered during peak hours will be billed differently than electrical energy billed during non-peak hours. As will be explained in greater detail below, first processor 14 determines units of electrical energy while processor 16, in the TOU mode, qualifies such energy units in relation to the time such units were determined, i.e. the season as well as the time of day.

All indicators and test features are brought out through the face of meter 10, either on LCD 30 or through optical communications port 40. Power supply 20 for the electronics is a switching power supply feeding low voltage linear supply 22. Such an approach allows a wide operating voltage range for meter 10.

In the preferred embodiment of the present invention, the so-called standard meter components and register electronics are for the first time all located on a single printed circuit board (not shown) defined as an electronics assembly. This electronics assembly houses power supplies 20, 22, 24 and 28, resistive dividers 12A–12C for all three phases, the shunt resistor portion of 18A–18C, oscillator 34, processor 14, processor 16, reset circuitry, EEPROM 35, oscillator 32, optical port components 40, LCD 30, and an option board interface 38. When this assembly is used for demand metering, the billing data is stored in EEPROM 35. This same assembly is used for TOU metering applications by merely utilizing battery 26 and reprogramming the configuration data in EEPROM 35. The additional time-of-use billing data is stored in the internal RAM of processor 16, which RAM is backed by battery 26.

Consider now the various components of meter 10 in greater detail. Primary current being metered may be sensed using conventional current transformers. The shunt resistor portion of devices 18A–18C are located on the electronics assembly.

The phase voltages are brought directly to the electronic assembly where resistive dividers 12A–12C scale these inputs to processor 14. In the preferred embodiment, the electronic components are referenced to the vector sum of each line voltage for three wire delta systems and to earth ground for all other services. Resistive division is used to divide the input voltage so that a very linear voltage with minimal phase shift over a wide dynamic range can be obtained. This in combination with a switching power supply allows the wide voltage operating range to be implemented.

Figure 2:
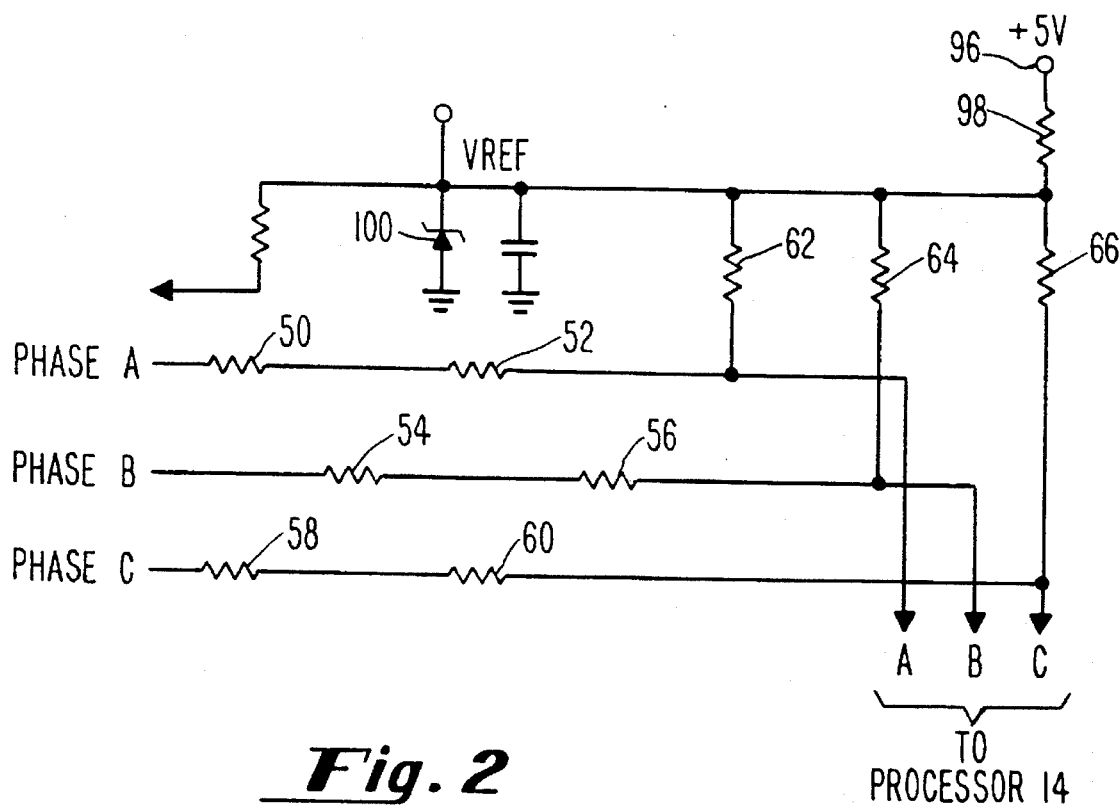
FIG. 2 is a schematic diagram of the resistive dividers shown in FIG. 1.
Figure 3:
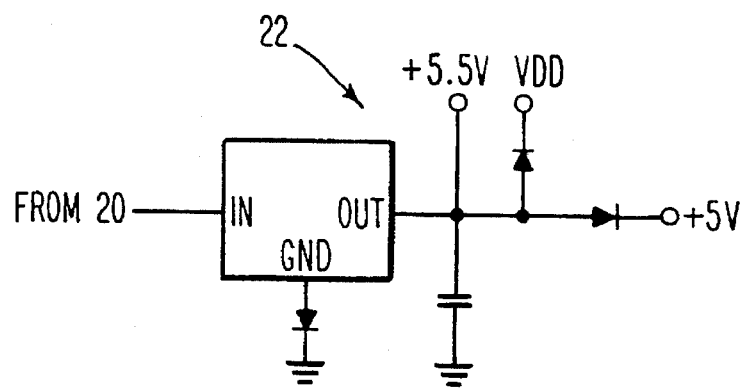
FIG. 3 is a schematic diagram of the linear power supply shown in FIG. 1.

Referring briefly to FIG. 2, each resistive divider consists of two 1 Meg, ½ watt resistors 50/52, 54/56 and 58/60, respectively. Resistors 50–60 are used to drop the line voltage at an acceptable watt loss. Each resistor pair feeds a resistor 62, 64 and 66, respectively. Resistors 62–66 are metal film resistors having a minimal temperature coefficient. This combination is very inexpensive compared to other voltage sensing techniques. Resistors 50–60 have an operating voltage rating of 300 Vrms each. These resistors have been individually tested with the 6 kV IEEE 587 impulse waveforms to assure that the resistance is stable and that the devices are not destroyed. Resistors 62–66 scales the input voltage to be less than 1 Volt peak to peak to processor 14. Resistors 62–66 should be in the range of from about 100 ohms to about 1K ohms to assure this maximum voltage and maintain maximum signal.

On grounded, three wire delta systems, those components of the electronics assembly operating on logic voltage levels (including the battery connector) can be at an elevated voltage. In such situations, the two, 1 Meg resistor combinations (50/52, 54/56, 58/60) provide current limiting to the logic level electronics. The worse case current occurs during testing of a 480 V, 3 wire delta meter with single phase excitation.

It will be appreciated that energy units are calculated in processor 14 primarily from multiplication of voltage and current. The preferred embodiment of processor 14, referenced above as being described in copending application Ser. No. 839,182 field on Feb. 21, 1992, and abandoned in favor of application Ser. No. 259,578, includes three analog to digital converters. The necessity for three converters is primarily due to the absense of voltage transformers, present in prior meters.

The M37428 microcontroller 16 is a 6502 (a traditional 8 bit microprocessor) derivative with an expanded instruction set for bit test and manipulation. This microcontroller includes substantial functionality including internal LCD drivers (128 quadraplexed segments), 8 kbytes of ROM, 384 bytes of RAM, a full duplex hardware UART, 5 timers, dual clock inputs (32.768 kHz and up to 8 MHz), and a low power operating mode.

During normal operation, processor 16 receives the 4.1472 MHz clock from processor 14 as described above. Such a clock signal translates to a 1.0368 MHz cycle time. Upon power fail, processor 16 shifts to the 32.768 kHz crystal oscillator 32. This allows low power operation with a cycle time of 16.384 kHz. During a power failure, processor 16 keeps track of time by counting seconds and rippling the time forward. Once processor 16 has rippled the time forward, a WIT instruction is executed which places the unit in a mode where only the 32.768 kHz oscillator and the timers are operational. While in this mode a timer is setup to "wake up" processor 16 every 32,768 cycles to count a second.

Consider now the particulars of the power supplies shown in FIG. 1. As indicated previously, the off-line switching supply 20 is designed to operate over a 96–528 VAC input range. It connects directly to the Phase A voltage alternating current (AC) line and requires no line frequency transformer. A flyback converter serves as the basis of the circuit. A flyback converter is a type of switching power supply.

As used herein, the "AC cycle" refers to the 60 Hz or 50 Hz input to power supply 20. The "switching cycle" refers to the 50 kHz to 140 kHz frequency at which the switching transformer of power supply 20 operates. It will be noted that other switching cycle frequences can be used.

Figure 4:
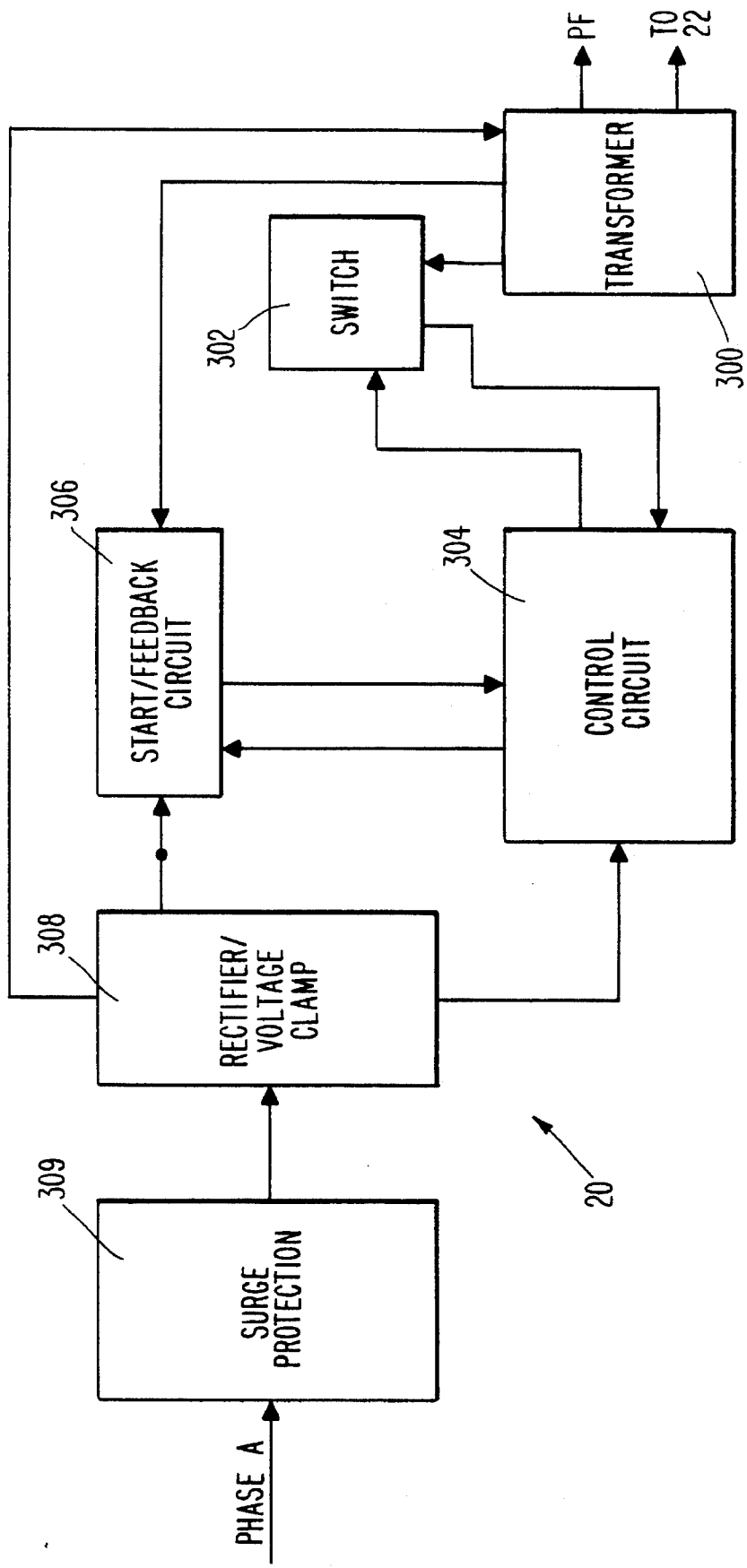
FIG. 4 is a block diagram of the power supply shown in FIG. 1.

Referring now to FIG. 4, power supply 20 for use in electronic meters includes a transformer 300 having primary and secondary windings. The input voltage (Phase A Voltage) is provided to the primary winding so that current may flow therethrough. As will be appreciated from FIG. 5, the secondary winding defines the output of the power supply. Referring back to FIG. 4, a switching member 302 is connected to the primary winding of transformer 300. Switching member 302 permits and prevents the flow of current through the primary winding. Switch member 302 is operable in response to a control signal, which control signal is generated by control circuit 304. Controller 304 generates the control signal in response to a limit signal generated by the start/feedback circuit 306 in response to the output of power supply 20. Voltage clamp 308 serves to limit the voltage applied to transformer 300 and switch 302. Surge protection circuit 309 is provided at the input to protect against surges appearing in the Phase A voltage.

Figure 5:
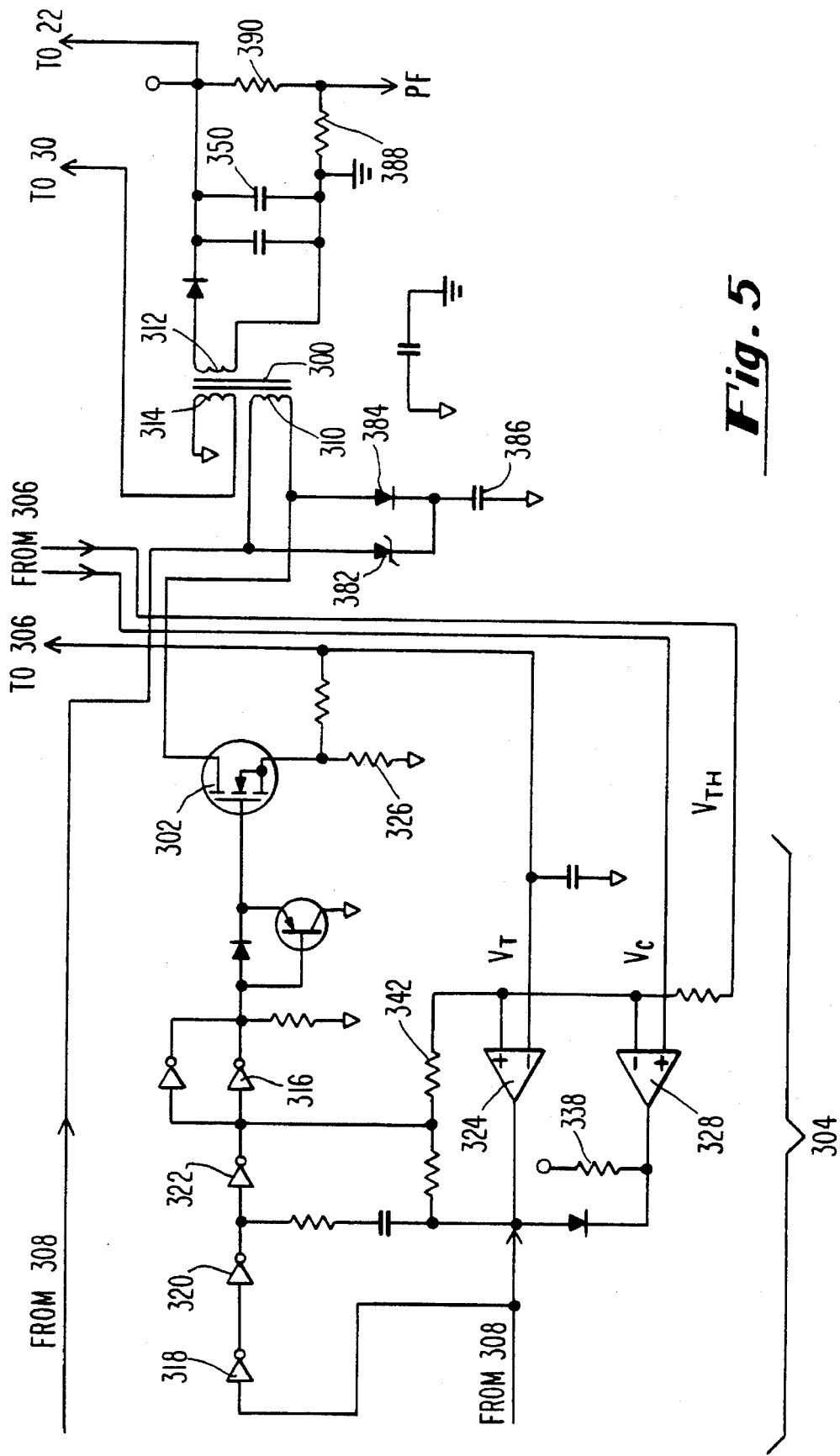
FIG. 5 is a schematic diagram of the control and switching members shown in FIG. 4.

Referring now to FIG. 5, transformer 300 and switch 302 are shown in greater detail. It will be appreciated that switch 302 is a transistor. At the beginning of each switching cycle, transistor 302 "turns on", i.e. becomes conductive, and magnetizes the core of transformer 300 by applying voltage across the primary 310. At the end of each cycle, transistor 302 turns off and allows the energy stored in the core of transformer 300 to flow to the output of the power supply, which "output" can be generally defined by secondary 312. Simultaneously, energy flows out of the bootstrap or tertiary winding 314 to power the control circuitry 304 through the start/feedback circuit 306.

Feedback circuit 306 and controller 304 control the output of power supply 20 by varying the ON time of transistor 302. Controller 304 will be described in greater detail in relation to FIG. 5. Transistor 302 is connected through inverter 316 to receive the output of an oscillator formed from inverters 318, 320 and 322. It will be recognized that such inverters form a ring oscillator. The oscillator has a free-run frequency of 50 KHz. The ON time of transistor 302 may vary between 200 ns and 10 μs. The OFF time is always between 8 and 10 μs. During operation, the bootstrap winding 314 of transformer 300 powers controller 304, but this power is not available until the power supply has started through the start/feedback circuit 306. The control circuit is a current-mode regulator.

At the beginning of a switching cycle, transistor 302 is turned ON by the oscillator output. If left alone, transistor 302 would also be turned OFF by the oscillator output. Transistor 302 remains ON until the current in primary 310 of transformer 300 ramps up to the threshold current level $I_{th}$ represented as a voltage $V_{th}$. As will be explained below, $V_{th}$ is generated by feedback circuit 306. When the primary current of transformer 300, represented as a voltage $V_i$ and sensed by resistor 326, ramps up to the threshold level $V_{th}$, comparator 324 terminates the ON period of the oscillator by forcing the oscillator output HIGH, which output in turn is inverted by inverter 316, shutting OFF transistor 302. Transistor 302 then turns OFF until the next switching cycle. Since the $V_{th}$ indirectly controls the ON time of transistor 302, controller 304 regulates the output voltage of the power supply by comparing the sensed current in transformer 300 to this threshold level.

Transistor 362 and comparator 326 can disable the oscillator. Transistor 362, described in greater detail in FIG. 7, disables the oscillator when the line voltage exceeds 400 volts. Comparator 328 disables the oscillator when the controller 304 has insufficient voltage to properly drive transistor 302. The voltage in controller 304, $V_c$, will be described in relation to FIG. 5.

Figure 6:
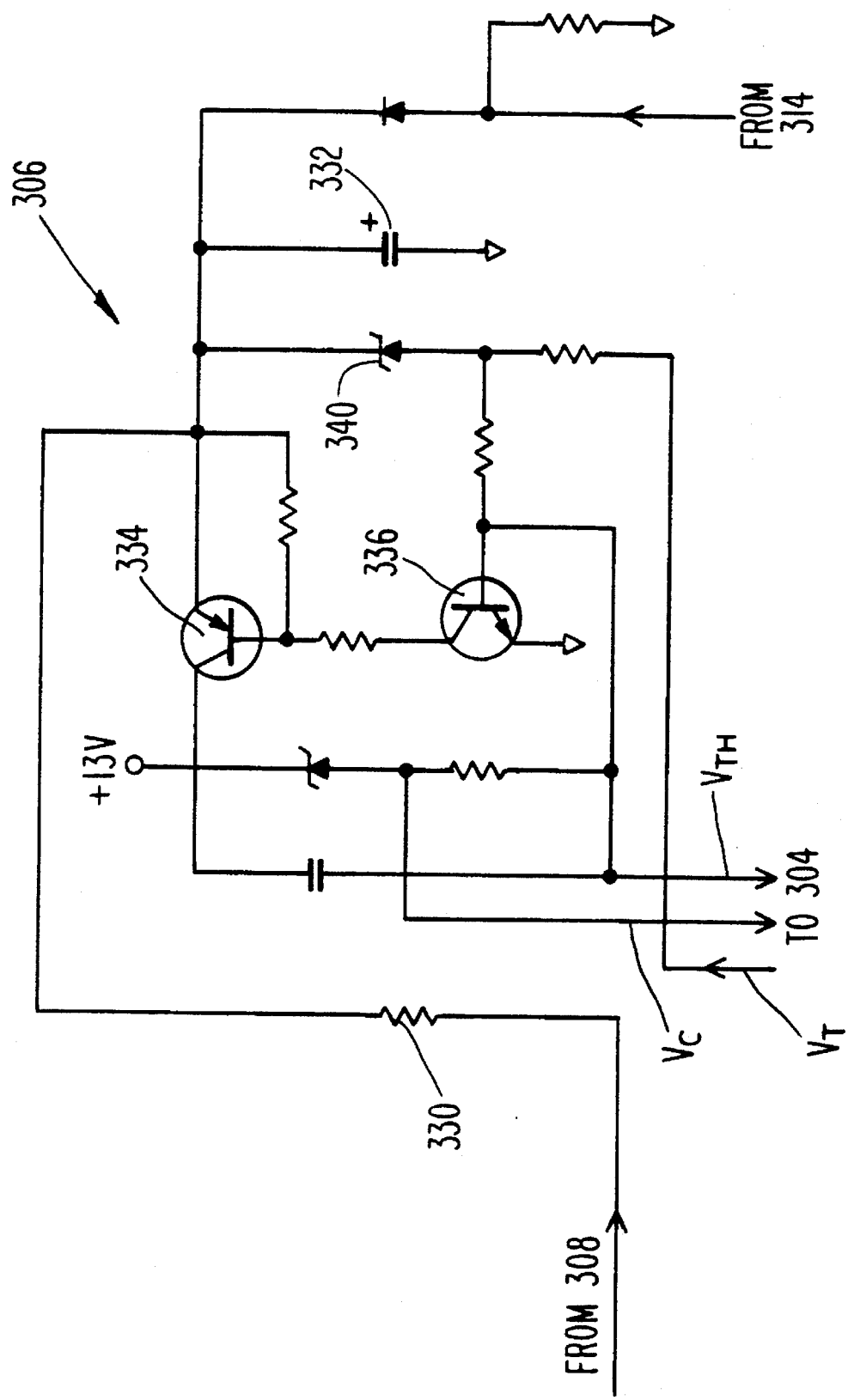
FIG. 6 is a schematic diagram of the startup/feedback shown in FIG. 4.

Consider now feedback circuit 306, shown in FIG. 6. When connected to the Phase A Voltage, resistor 330 slowly charges capacitor 332. The high value of resistor 330 and the 400 volt limit by voltage clamp 308 limit the power dissipation of resistor 330. After a few seconds, capacitor 332 charges above 13 volts. Transistors 334 and 336 then provide positive feedback to each other and snap ON. Controller 304 can run for tens of milliseconds from the charge stored in capacitor 332. Normally, power supply 20 will successfully start and begin to power itself in this period. If it fails to start, transistors 334 and 336 turn OFF when the charge across capacitor 332 drops below 8.5 volts and capacitor 332 again charges through resistor 330. This cycle repeats until the supply starts.

With high input voltages and without resistor 338 (FIG. 5), the current sourced by resistor 330 can hold the control and start-up circuits in a disabled state that does not recycle. When Capacitor 332 drops below 8.5 volts, resistor 338 places a load on the control circuit supply. This load insures that the start-up circuit recycles properly with high input voltages.

As indicated above, when the primary current of transformer 300 sensed by resistor 326 ramps up to the threshold level $V_{th}$, comparator 324 can terminate the ON period of the oscillator. When the voltage on capacitor 332 is less than 13 volts, zener diode 340 provides no voltage feedback. Under these conditions, the base-emitter voltage of transistor 336 sets the current threshold $I_{th}$ to about 650 mA. This maximum current limit protects transistor 302, as well as those transistors in voltage clamp 308, and prevents transformer 300 from saturating.

As the voltage on capacitor 332, which is representative of the output voltage of the supply, approaches the proper level, zener diode 340 begins to conduct and effectively reduces the current threshold, i.e. effectively reduces $V_{th}$. Each switching cycle will then transfers less power to the output, and the supply begins to regulate its output.

When the regulating circuitry requires ON times of transistor 302 less than about 400 ns, the current sense circuitry does not have time to react to the primary current of transformer 300. In that case, the regulating circuit operates as a voltage-mode pulse width modulator. Resistor 342 (FIG. 5) generates a negative step at comparator 324 at the beginning of each switching cycle. The regulator feedback voltage at comparator 324, which contains little current information at the beginning of each switching cycle, translates the step into various input overdrives of comparator 324, thereby driving the output of comparator 324 to a logic HIGH level. The propagation time of the comparator 324 decreases with increasing overdrive, i.e. as the negative step increases, and the circuit acts as a pulse width modulator. The negative step will increase due to the changing level of $V_{th}$.

Any leakage inductance between the bootstrap winding and the output winding causes inaccurate tracking between the voltage on capacitor 332 and the output voltage of the supply. This leakage inductance can cause poor load regulation of the supply. The bootstrap and output windings are bifilar wound; they are tightly coupled, have little leakage inductance, and provide acceptable load regulation. Since the two windings are in direct contact, the bootstrap winding requires Teflon insulation to meet the isolation voltage specifications. A 100% hi-pot test during manufacture insures the integrity of the insulation.

Figure 7:
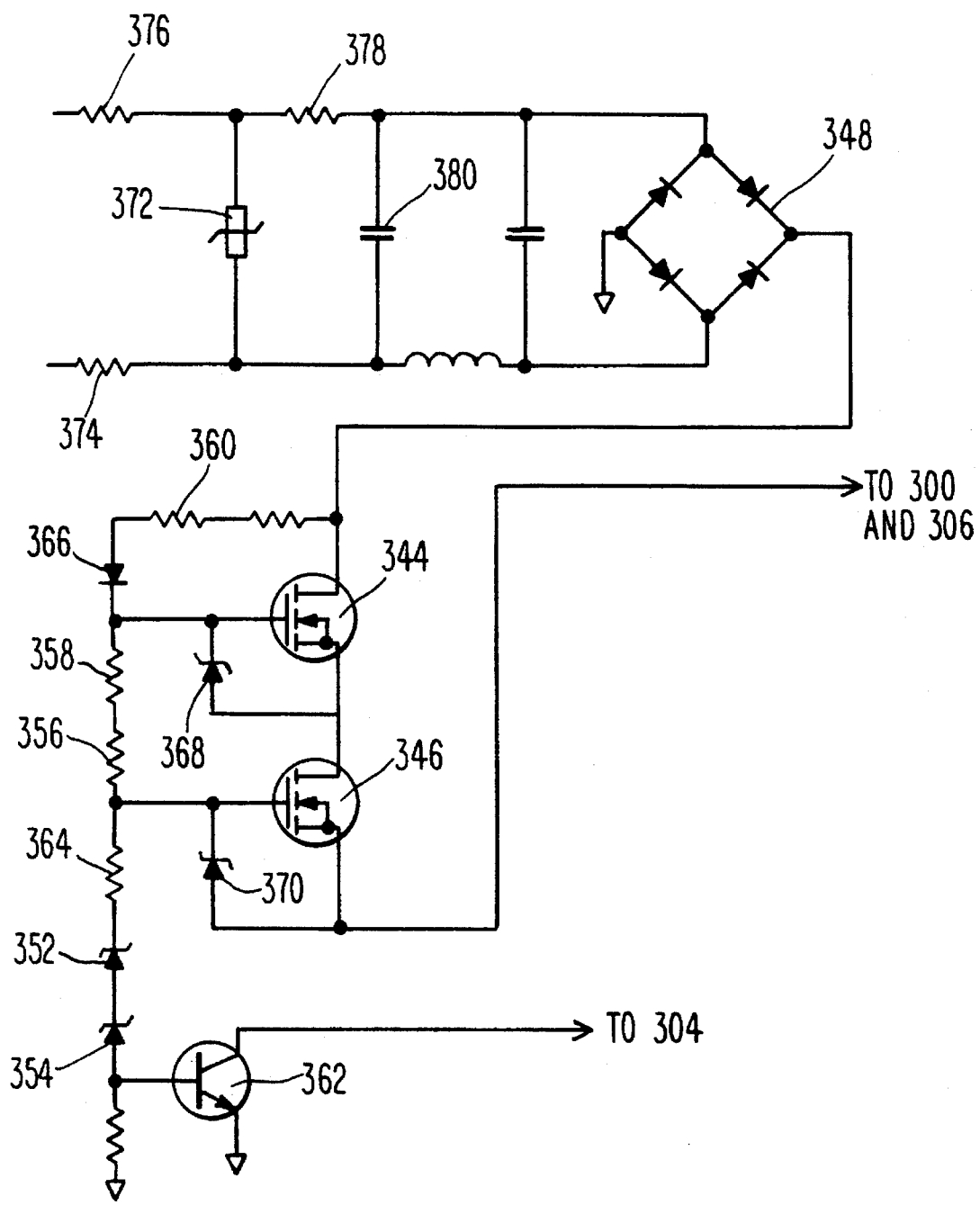
FIG. 7 is a schematic diagram of the voltage clamp shown in FIG. 4.

Consider now the details of voltage clamp 308, shown in FIG. 7. A 528 VAC input corresponds to 750 VDC after rectification. Switching transistors that can directly handle these voltages are extremely expensive. By using the voltage clamp of the present invention, relatively inexpensive switching transistors can be utilized.

In power supply 20, the switching member 302 is shut down during parts of the AC cycle that exceed 400 volts. The switching transistor, transistor 302, in conjunction with two other transistors 344 and 346, can hold off 750 VDC. During surge conditions, these three transistors can withstand over 1500 volts. In the preferred embodiment, transistors 302, 344 and 346 are 600-volt MOSFETs.

Because high-voltage electrolytic capacitors are expensive and large, this voltage clamp 308 has no bulk filter capacitor after the bridge rectifier 348. Without a bulk filter capacitor, this switching converter must shut down during parts of the AC cycle. It intentionally shuts down during parts of the AC cycle that exceed 400 volts, and no input power is available when the AC cycle crosses zero. The 2200 μF output capacitor 350 (FIG. 5), provides output current during these periods.

As discussed above, transistors 344 and 346 act as a voltage clamp and limit the voltage applied to switching member 302. At a 528 VAC line voltage, the input to the clamping circuit reaches 750 volts. During lightning-strike surges, this voltage may approach 1500 volts. When the voltage at the output of bridge rectifier 348 exceeds 400 volts, zener diodes 352 and 354 begin to conduct. These diodes, along with the 33 KΩ resistors 356, 358 and 360, create bias voltages for transistors 344 and 346. Transistors 344 and 346 act as source followers and maintain their source voltages a few volts below their gate voltages.

If, for example, the output of bridge rectifier 348 is at 1000 volts, the gates of transistors 344 and 346 will be at approximately 400 and 700 volts respectively. The source of transistor 344 applies roughly 700 volts to the drain of 346; the source of 346 feeds about 400 volts to switching member 302. Transistors 344 and 346 each drop 300 volts under these conditions and thereby share the drop from the 1000 volt input to the 400 volt output, a level which the switching converter 302 can withstand.

As zener diodes 352 and 354 begin to conduct and as transistors 344 and 346 begin to clamp, transistor 362 turns ON and shuts down the switching converter. Although transistors 344 and 346 limit the voltage fed to the converter to an acceptable level, they would dissipate an excessive amount of heat if the switching converter 302 consumed power during the clamping period.

When switching converter 302 shuts down, transistor 302 no longer has to withstand the flyback voltage from transformer 300. Resistor 364 takes advantage of this by allowing the output voltage of the clamp to approach 500 volts (instead of 400 volts) as the input to the clamp approaches 1500 volts. This removes some of the burden from transistors 344 and 346.

Zener diodes 352 and 354 are off and the converter 302 runs when the output of bridge rectifier 348 is below 400 volts. During these parts of the AC cycle, the 33 KΩ resistors 356, 358 and 360 directly bias the gates of transistors 344 and 346. The voltage drop across transistors 344 and 346 is then slightly more than the threshold voltages of those transistors along with any voltage drop generated by the channel resistance of those transistors.

During the off time of transistor 302, about 10 μS, the 33 KΩ resistors can no longer bias the gates of transistors 344 and 346. Diode 366 prevents the gate capacitance of transistors 344 and 346 and the junction capacitance of zeners 368 and 370 from discharging when transistor 302 is off. This keeps transistors 344 and 346 ON and ready to conduct when transistor 302 turns ON at the next switching cycle. If the gates of transistors 344 and 346 had discharged between switching cycles, they would create large voltage drops and power losses during the time required to recharge their gates through the 33 KΩ resistors.

In the preferred embodiment, two 33 KΩ resistors are used in series to obtain the necessary voltage capability from 966 surface-mount packages.

This power supply must withstand an 8 KV, 1.2×50 μS short-branch test. Varistor 372, resistors 374,376 and 378, and capacitor 380 protect the power supply from lightning strike surges.

A 550 VAC varistor 372 serves as the basis of the protection circuit. It has the lowest standard voltage that can handle a 528 VAC input. The device has a maximum clamping voltage of 1500 volts at 50 amps.

A varistor placed directly across an AC line is subject to extremely high surge currents and may not protect the circuit effectively. High surge currents can degrade the varistor and ultimately lead to catastrophic failure of the device. Input resistors 374 and 376 limit the surge currents to 35 amps.

This insures that the clamping voltage remains below 1500 volts and extends the life of the varistor to tens of thousands of strikes.

Resistor 378 and capacitor 380 act as an RC filter. The filter limits the rate of voltage rise at the output of the bridge rectifier. The voltage clamping circuit, transistors 344 and 346, is able to track this reduced dv/dt. Current forced through diodes 382, 384 and capacitor 386 (FIG. 5) is also controlled by the limited rate of voltage rise.

Resistors 374 and 376 are 1 watt carbon composition resistors. These resistors can withstand the surge energies and voltages. Resistor 378 is a flame-proof resistor that acts as a fuse in the event of a failure in the remainder of the circuit.

The values of resistors 374, 376 and 378 are low enough so that they do not interfere with the operation of the power supply or dissipate excessive amounts of power.

Finally it is noted that resistors 388 and 390 act to generate the power fail voltage PF.

By using the wide voltage ranging of the invention, a single meter can be used in both a four wire wye application as well as in a four wire delta application. It will be recognized that a four wire delta application includes 96 V sources as well as a 208 V source. In the past such an application required a unique meter in order to accomodate the 208 V source. Now all sources can be metered using the same meter used in a four wire wye application.

While the invention has been described and illustrated with reference to specific embodiments, those skilled in the art will recognize that modification and variations may be made without departing from the principles of the invention as described herein above and set forth in the following claims.

What is claimed is:

1. A power supply for use in apparatus for electronically measuring electrical energy supplied by an electrical service provider, said electrical energy being specified from a wide range of service voltages supplied by electrical service providers, said power supply comprising:

a transformer comprising first and second windings, wherein an input voltage based on said wide range of service voltages is provided to said first winding so that current flows through said first winding, said second winding defines the output of said power supply, wherein said output is regulated to provide a predetermined output voltage independent of said input voltage, wherein said wide range of service voltages include RMS voltages between about 96 Vrms and about 528 Vrms.

2. The power supply of claim 1, wherein said transformer comprises a third winding substantially similar to said second winding, so the voltage across said third winding is similar to the voltage across said second winding.

3. The power supply of claim 1, further comprising a charge means, connected to said second winding, for storing an electrical charge when current is flowing through said first winding and for discharging stored electrical charge when current flowing through said first winding is interrupted.

4. The power supply of claim 1, further comprising:

switching means, connected to said first winding, for permitting and preventing the flow of current through said first winding, wherein said switch means is operable in response to a control signal; and control means, connected to said switching means and to said second winding, for generating said control signal in response to the output of said power supply.

5. The power supply of claim 4, wherein said control signal operates to disable said switch means.

6. The power supply of claim 4, wherein said switching means comprises a first transistor, connected between said first winding and ground, and wherein said control means comprises an oscillator, connected to the base of said transistor, for generating an oscillating signal for switching said transistor on and off, wherein said control signal causes the output of said oscillator to disable said first transistor.

7. The power supply of claim 6, wherein said first transistor comprises a 600 volt MOSFET device.

8. The power supply of claim 6, wherein said oscillator comprises a ring oscillator.

9. The power supply of claim 4, wherein said control means comprises an over current protection detector and a means for voltage protection control.

10. The power supply of claim 9, wherein said control signal is generated in response to an output of one of said over current protection detector and said means for voltage protection control.

11. The power supply of claim 9, wherein said transformer further comprises a third winding operatively interfaced to provide feedback to said means for voltage protection control thereby regulating said output, wherein said output is electrically isolated from said first winding.

12. The power supply of claim 4, further comprising voltage clamping means, connected to said transformer and said switch means, wherein said input voltage is applied to said voltage clamping means, for limiting the voltage applied to said transformer.

13. The power supply of claim 12, wherein said clamping means comprises first and second transistors and biasing means, connected to said first and second transistors, wherein said biasing means biases said first and second transistors so that the voltage provided by said clamping means does not exceed a desired level.

14. The power supply of claim 12, wherein said clamping means disables said switch means when said input voltage exceeds said desired level.

15. A method for supplying power in apparatus for electronically metering electrical energy supplied by an electrical service provider, said electrical energy being specified from a wide range of service voltages supplied by electrical service providers, said method comprising the steps of:

providing a transformer comprising first, second and third windings and providing an input voltage based on said wide range of service voltages to said first winding so that current flows through said first winding and wherein said second winding defines an output;

permitting and preventing the flow of current through said first winding in response to a control signal thereby regulating the output to a predetermined output voltage independent of said input voltage;

generating said control signal in response to said third winding; and wherein said wide range of service voltages include RMS voltages between about 96 Vrms and about 528 Vrms.

16. The method of claim 15, wherein said control signal operates to disable said step of permitting and preventing the flow of current.

17. The method of claim 16, further comprising the step of generating an oscillating signal, wherein said step of permitting the flow of current is initiated by said oscillating signal and wherein said step of preventing said flow of current is initiated by said control signal.

18. The method of claim 15, wherein said step of generating said control signal comprises the steps of sensing the current flowing through said first winding and generating a sensed current signal, generating a reference current signal in response to said output comparing said sensed current and said reference current.

19. The method of claim 18, wherein said step of generating said control signal comprises the step of generating said control signal in response to said step of comparing determining that said sensed current signal exceeds said reference current signal.

20. The method of claim 15, wherein said step of permitting and preventing the flow of current through said first winding comprises the step of providing electronic components connected to permit and prevent the flow of current, said method further comprising the step of limiting the voltage applied to said transformer and to said components.

21. A method for supplying power in apparatus for electronically metering electrical energy supplied by an electrical service provider, said electrical energy being specified from a wide range of service voltages supplied by electrical service providers, said method comprising the steps of:

providing a transformer comprising first, second and third windings and providing an input voltage based on said wide range of service voltages to said first winding so that current flows through said first winding and wherein said second winding defines an output;

permitting and preventing the flow of current through said first winding in response to a control signal thereby regulating the output to a predetermined output voltage independent of said input voltage;

generating said control signal in response to said third winding; and wherein the service voltages comprise 120 Vrms, 208 Vrms, 240 Vrms, 277 Vrms, and 480 Vrms, each said service voltage having a predetermined acceptable tolerance defining a lowest tolerance below the service voltage and a highest tolerance above the service voltage, and wherein said wide range of service voltages includes at least two of said service voltages and defines a range from the lowest tolerance of the lowest of the at least two service voltages to the highest tolerance of the highest of the at least two service voltages.

22. The method of claim 21, wherein said control signal operates to disable said step of permitting and preventing the flow of current.

23. The method of claim 22, further comprising the step of generating an oscillating signal, wherein said step of permitting the flow of current is initiated by said oscillating signal and wherein said step of preventing said flow of current is initiated by said control signal.

24. The method of claim 21, wherein said step of generating said control signal comprises the steps of sensing the current flowing through said first winding and generating a sensed current signal, generating a reference current signal in response to said output comparing said sensed current and said reference current.

25. The method of claim 24, wherein said step of generating said control signal comprises the step of generating said control signal in response to said step of comparing determining that said sensed current signal exceeds said reference current signal.

26. The method of claim 21, wherein said step of permitting and preventing the flow of current through said first winding comprises the step of providing electronic components, connected to permit and prevent the flow of current, said method further comprising the step of limiting the voltage applied to said transformer and to said components.

27. A power supply for use in apparatus for electronically measuring electrical energy supplied by an electrical service provider, said electrical energy being specified from a wide range of service voltages supplied by electrical service providers, said power supply comprising:

a transformer comprising first and second windings, wherein an input voltage based on said wide range of service voltages is provided to said first winding so that current flows through said first winding, said second winding defines the output of said power supply, wherein said output is regulated to provide a predetermined output voltage independent of said input voltage, wherein said power supply is operable with both 120 Vrms and 480 Vrms standard services without modification thereto.

28. The power supply of claim 27, wherein said transformer comprises a third winding substantially similar to said second winding, so the voltage across said third winding is similar to the voltage across said second winding.

29. The power supply of claim 27, further comprising a charge means, connected to said second winding, for storing an electrical charge when current is flowing through said first winding and for discharging stored electrical charge when current flowing through said first winding is interrupted.

30. The power supply of claim 27, further comprising:

switching means, connected to said first winding, for permitting and preventing the flow of current through said first winding, wherein said switch means is operable in response to a control signal; and control means, connected to said switching means and to said second winding, for generating said control signal in response to the output of said power supply.

31. The power supply of claim 30, wherein said control signal operates to disable said switch means.

32. The power supply of claim 30, wherein said switching means comprises a first transistor, connected between said first winding and ground, and wherein said control means comprises an oscillator, connected to the base of said transistor, for generating an oscillating signal for switching said transistor on and off, wherein said control signal causes the output of said oscillator to disable said first transistor.

33. The power supply of claim 32, wherein said first transistor comprises a 600 volt MOSFET device.

34. The power supply of claim 32, wherein said oscillator comprises a ring oscillator.

35. The power supply of claim 30, wherein said control means comprises an over current protection detector and a means for voltage protection control.

36. The power supply of claim 35, wherein said control signal is generated in response to an output of one of said over current protection detector and said means for voltage protection control.

37. The power supply of claim 35, wherein said transformer further comprises a third winding operatively interfaced to provide feedback to said means for voltage protection control thereby regulating said output, wherein said output is electrically isolated from said first winding.

38. The power supply of claim 30, further comprising voltage clamping means, connected to said transformer and said switch means, wherein said input voltage is applied to said voltage clamping means, for limiting the voltage applied to said transformer.

39. The power supply of claim 38, wherein said clamping means comprises second and third transistors and biasing means, connected to said second and third transistors, wherein said biasing means biases said second and third transistors so that the voltage provided by said clamping means does not exceed a desired level.

40. The power supply of claim 38, wherein said clamping means disables said switch means when said input voltage exceeds said desired level.

41. A power supply for use in apparatus for electronically measuring electrical energy supplied by an electrical service provider, said electrical energy being specified from a wide range of service voltages supplied by electrical service providers, said power supply comprising:

a transformer comprising first and second windings, wherein an input voltage based on said wide range of service voltages is provided to said first winding so that current flows through said first winding, said second winding defines the output of said power supply, wherein said output regulated to provide a predetermined output voltage independent of said input voltage, wherein the service voltages comprise 120 Vrms, 208 Vrms, 240 Vrms, 277 Vrms, and 480 Vrms, each said service voltage having a predetermined acceptable tolerance defining a lowest tolerance below the service voltage and a highest tolerance above the service voltage, and wherein said wide range of service voltages includes at least two of said service voltages and defines a range from the lowest tolerance of the lowest of the at least two service voltages to the highest tolerance of the highest of the at least two service voltages.

42. The power supply of claim 41, wherein said transformer comprises a third winding substantially similar to said second winding, so the voltage across said third winding is similar to the voltage across said second winding.

43. The power supply of claim 41, further comprising a charge means, connected to said second winding, for storing an electrical charge when current is flowing through said first winding and for discharging stored electrical charge when current flowing through said first winding is interrupted.

44. The power supply of claim 41, further comprising:

switching means, connected to said first winding, for permitting and preventing the flow of current through said first winding, wherein said switch means is operable in response to a control signal; and control means, connected to said switching means and to said second winding, for generating said control signal in response to the output of said power supply.

45. The power supply of claim 44, further comprising voltage clamping means, connected to said transformer and said switch means, wherein said input voltage is applied to said voltage clamping means, for limiting the voltage applied to said transformer.

46. The power supply of claim 45, wherein said clamping means comprises second and third transistors and biasing means, connected to said second and third transistors wherein said biasing means biases said second and third transistors so that the voltage provided by said clamping means does not exceed a desired level.

47. The power supply of claim 45, wherein said clamping means disables said switch means when said input voltage exceeds said desired level.

48. The power supply of claim 44, wherein said control means comprises an over current protection detector and a means for voltage protection control.

49. The power supply of claim 48, wherein said control signal is generated in response to an output of one of said over current protection detector and said means for voltage protection control.

50. The power supply of claim 48, wherein said transformer further comprises a third winding operatively interfaced to provide feedback to said means for voltage protection control thereby regulating said output, wherein said output is electrically isolated from said first winding.

51. The power supply of claim 44, wherein said switching means comprises a first transistor, connected between said first winding and ground, and wherein said control means comprises an oscillator, connected to the base of said transistor, for generating an oscillating signal for switching said transistor on and off, wherein said control signal causes the output of said oscillator to disable said first transistor.

52. The power supply of claim 51, wherein said first transistor comprises a 600 volt MOSFET device.

53. The power supply of claim 51, wherein said oscillator comprises a ring oscillator.

54. The power supply of claim 44, wherein said control signal operates to disable said switch means.

55. A power supply for use in apparatus for electronically measuring electrical energy supplied by an electrical service provider, said electrical energy being specified from a wide range of service voltages supplied by electrical service providers, said power supply comprising:

a transformer comprising first and second windings, wherein an input voltage based on said wide range of service voltages is provided to said first winding so that current flows through said first winding, said second winding defines the output of said power supply, wherein said output is regulated to provide a predetermined output voltage independent of said input voltage, wherein said power supply is operable with both 120 Vrms and 277 Vrms standard services without modification thereto.

56. The power supply of claim 55, wherein said transformer comprises a third winding substantially similar to said second winding, so the voltage across said third winding is similar to the voltage across said second winding.

57. The power supply of claim 55, further comprising:

switching means, connected to said first winding, for permitting and preventing the flow of current through said first winding, wherein said switch means is operable in response to a control signal; and control means, connected to said switching means and to said second winding, for generating said control signal in response to the output of said power supply.

58. The power supply of claim 57, further comprising voltage clamping means, connected to said transformer and said switch means, wherein said input voltage is applied to said voltage clamping means, for limiting the voltage applied to said transformer.

59. The power supply of claim 58, wherein said clamping means comprises second and third transistors and biasing means, connected to said second and third transistors wherein said biasing means biases said second and third transistors so that the voltage provided by said clamping means does not exceed a desired level.

60. The power supply of claim 58, wherein said clamping means disables said switch means when said input voltage exceeds said desired level.

61. The power supply of claim 57, wherein said control means comprises an over current protection detector and a means for voltage protection control.

62. The power supply of claim 61, wherein said control signal is generated in response to an output of one of said over current protection detector and said means for voltage protection control.

63. The power supply of claim 61, wherein said transformer further comprises a third winding operatively interfaced to provide feedback to said means for voltage protection control thereby regulating said output, wherein said output is electrically isolated from said first winding.

64. The power supply of claim 57, wherein said switching means comprises a first transistor, connected between said first winding and ground, and wherein said control means comprises an oscillator, connected to the base of said transistor, for generating an oscillating signal for switching said transistor on and off, wherein said control signal causes the output of said oscillator to disable said first transistor.

65. The power supply of claim 64, wherein said first transistor comprises a 600 volt MOSFET device.

66. The power supply of claim 64, wherein said oscillator comprises a ring oscillator.

67. The power supply of claim 57, wherein said control signal operates to disable said switch means.

68. The power supply of claim 55, further comprising a charge means, connected to said second winding, for storing an electrical charge when current is flowing through said first winding and for discharging stored electrical charge when current flowing through said first winding is interrupted.

* * * * *

UNITED STATES PATENT AND TRADEMARK OFFICE
CERTIFICATE OF CORRECTION

PATENT NO. : 5,621,629

DATED : April 15, 1997

INVENTOR(S) : Rodney C. Hemminger et al.

It is certified that error appears in the above-identified patent and that said Letters Patent is hereby corrected as shown below:

*In the Abstract, delete the following two sentences in lines 3 through 7:*

"The wide ranging meter includes a processing unit for processing divided input voltage and a current component in order to determine electrical energy metering values. The processing unit is operable in response to supply voltages."

Col 14 (Claim 41), line 15, after "wherein said output" insert --is--

Signed and Sealed this

Sixteenth Day of March, 1999

Attest:

Attesting Officer

Q. TODD DICKINSON

Acting Commissioner of Patents and Trademarks